United States Patent
Caporale et al.

(10) Patent No.: US 10,867,654 B2
(45) Date of Patent: Dec. 15, 2020

(54) METHOD FOR TESTING A MEMORY DEVICE

(71) Applicant: XEROX CORPORATION, Norwalk, CT (US)

(72) Inventors: Christopher P. Caporale, Rochester, NY (US); Alberto Rodriguez, Webster, NY (US); Markus R. Silvestri, Fairport, NY (US); Terry L. Street, Fairport, NY (US)

(73) Assignee: XEROX CORPORATION, Norwalk, CT (US)

( * ) Notice: Subject to any disclaimer, the term of this patent is extended or adjusted under 35 U.S.C. 154(b) by 3 days.

(21) Appl. No.: 16/250,908

(22) Filed: Jan. 17, 2019

(65) Prior Publication Data
US 2020/0234752 A1  Jul. 23, 2020

(51) Int. Cl.
G11C 7/18 (2006.01)
G11C 11/22 (2006.01)
G11C 8/14 (2006.01)

(52) U.S. Cl.
CPC ............ *G11C 11/2277* (2013.01); *G11C 7/18* (2013.01); *G11C 8/14* (2013.01); *G11C 11/2273* (2013.01)

(58) Field of Classification Search
CPC .............................. G11C 11/2277; G11C 7/18
USPC ........................................................ 365/145
See application file for complete search history.

(56) References Cited

U.S. PATENT DOCUMENTS

| | | |
|---|---|---|
| 4,961,088 A | 10/1990 | Gilliland et al. |
| 6,670,659 B1 | 12/2003 | Gudesen et al. |
| 9,886,571 B2 | 2/2018 | Caporale et al. |
| 10,453,537 B1* | 10/2019 | Reuter ................. G11C 29/028 |
| 2004/0042288 A1* | 3/2004 | Chow ..................... G11C 11/22 365/200 |
| 2006/0221672 A1* | 10/2006 | Drndic ................... B82Y 30/00 365/151 |
| 2011/0235420 A1* | 9/2011 | Sharon ................ G11C 11/5642 365/185.17 |
| 2012/0007002 A1* | 1/2012 | Nakayamada ......... B82Y 10/00 250/492.22 |
| 2014/0108891 A1* | 4/2014 | Strasser .............. G06F 12/0246 714/773 |
| 2014/0226398 A1* | 8/2014 | Desireddi .......... G11C 16/3436 365/185.03 |

(Continued)

*Primary Examiner* — Muna A Techane
(74) *Attorney, Agent, or Firm* — MH2 Technology Law Group LLP (57) ABSTRACT

A computer-implemented method for testing a printed memory device is provided. The computer-implemented method includes performing, by a controller, a first read operation on a cell of the printed memory device; performing, by the controller, a second read operation on the cell; converting, by the controller, a first result of the first read operation and a second results of the second read operation to a first digital value and a second digital value, respectively; comparing, by the controller, the first digital value and the second digital value to a first predetermined threshold and a second predetermined threshold, respectively, wherein the first predetermined threshold is a low threshold and the second predetermined threshold is a high threshold; and providing, by the controller, a result of the test for the printed memory device based on the comparing.

16 Claims, 4 Drawing Sheets

(56) References Cited

U.S. PATENT DOCUMENTS

2016/0019974 A1* 1/2016 Blodgett ............... G06F 11/106
  365/185.03
2018/0197619 A1* 7/2018 Chen .................... G11C 29/028

* cited by examiner

METHOD FOR TESTING A MEMORY DEVICE

TECHNICAL FIELD

The present teachings relate to the field of memory devices and product marking, for example, products including a tag or label for testing and/or inventory control and, more particularly, to readers and scanners for reading and/or writing data from/to a product marked with an electronic memory, tag, or label.

BACKGROUND

Xerox Printed Memory ("XPM") is a printed label that is capable of including rewritable memory. In one exemplary use, the labels may be used for testing to determine whether a product is faulty or functional, as well as authentic or genuine to prevent counterfeiting. For example, the printed memory may be attached as a label onto a consumable product, supply, shipment packaging, consumer product, document, customer-replaceable product, etc. Data from the printed memory may be read and compared to an expected result or value. If the value read from the printed memory by a memory reader matches the expected value, circuitry within the memory reader can identify the printed memory (and thus the item to which it is attached) as functional and/or authentic. In some uses, identification of the product as functional and/or authentic may be required before the product to which the printed memory is attached is allowed to function, in which case the memory reader, or a host device that incorporates the memory reader as a subsystem, can allow or enable functionality of the product. If the value read from the printed memory does not match the expected value, the circuitry within the reader or host device can designate the printed memory, and thus the item to which the printed memory is attached, as not functional and/or authentic, for example, as counterfeit, gray market, not manufactured by an original equipment manufacturer ("OEM") or a licensed manufacturer (i.e., non-OEM), etc. In some uses, the memory reader or host device can disable functionality of the product if the label attached to the product is identified as not functional and/or authentic.

In another implementation, XPM may be used to track a product through a manufacturing process and/or a supply chain. The labels can be programmed to mark individual items with a unique electronic identifier that may be verified with a memory reading device. Other uses for XPM are contemplated including, but not limited to, smart consumables where an object is associated with data that is later used by a base unit to improve or optimize performance, consumption records where bulk usage of a product supply is tracked, tracking of items or people outside of a manufacturing environment, etc.

A XPM includes a layer of ferroelectric material (i.e., a ferroelectric layer) positioned between a plurality of wiring lines (e.g., word lines and bit lines). A region of the ferroelectric layer situated between each bit line ("BL") and word line ("WL") forms a memory cell. The memory may be written with one of two digital memory states by applying a suitable write voltage to the wiring lines. The memory state may be read by applying a suitable read voltage to the wiring lines through contact pads. If the polarization of the cell is in the opposite direction of the electric field from the applied bias, then, the polarization changes or flips direction inducing a current that gets integrated into a charge value. A cell that has its polarization vector already aligned with the electric field will not flip; hence, produces a smaller charge value equivalent to the capacitive charge value of the cell. Thus, by the very nature of the reading process the information on the chip is destroyed because at the end of the reading process the polarization of all the cells point into the same direction.

Hence for a successful read it is paramount to have all cells connected because having less than all the cells connected will not produce a large enough charge if their polarization vectors were to be flipped. Disconnecting and reconnecting the memory and reading it again will not work either because the previous connected cells are now already flipped. However, more problematic is that the user will not even know that there was a bad connection because disconnected cells produce very low charge values that still get converted into bit 1 (non-flipping cells producing low values are associated with bit state 1). As a result, a digital read value of the memory is still produced, but unknowingly to the user, it is now wrong.

Accordingly, what is needed is an improved method for both detecting the presence of XPM devices and diagnosing the integrity of the memory device.

SUMMARY

The following presents a simplified summary in order to provide a basic understanding of some aspects of one or more implementations of the present teachings. This summary is not an extensive overview, nor is it intended to identify key or critical elements of the present teachings, nor to delineate the scope of the disclosure. Rather, its primary purpose is merely to present one or more concepts in simplified form as a prelude to the detailed description presented later.

In accordance with examples of the present disclosure, a computer-implemented method for testing a printed memory device is provided. The computer-implemented method comprises performing, by a controller, a first read operation on a cell of the printed memory device; performing, by the controller, a second read operation on the cell; converting, by the controller, the first result of the first read operation and the second result of the second read operation to a first digital value and a second digital value, respectively; comparing, by the controller, the first digital value and the second digital value to a first predetermined threshold and a second predetermined threshold, respectively, wherein the first predetermined threshold is a low threshold and the second predetermined threshold is a high threshold; and providing, by the controller, a result of the test for the printed memory device based on the comparing.

In some examples, the first predetermined threshold is a digital value that represents a charge of about 0.1 nC to about 1 nC.

In some examples, the first read operation and the second read operation is performed using a voltage that is less than a voltage that would change a state of the cell.

In some examples, the second predetermined threshold is a digital value that represents a charge of about 9 nC to about 11 nC or larger.

In some examples, the first predetermined threshold and the second predetermined threshold are based on the characteristics of the printed memory device.

In some examples, the result is that the cell is not properly connected if the first digital value and the second digital value do not meet the first predetermined threshold and the second predetermined threshold. The cell can be not properly connected if the cell is accidently connected to ground In some examples, the result is that the cell is properly connected if the first digital value and the second digital value meet the first predetermined threshold and the second predetermined threshold. In some examples, a properly connected cell can still be "bad/damaged" or not working properly. As a result, the second predetermined threshold can be used to detect this situation that can result in excessive leaks.

In accordance with examples of the present disclosure, an electronic system for testing a test cell is provided. The electronic system comprises a host device; a component subsystem installed in the host device, wherein the component subsystem comprises a test module configured to receive a first test voltage value and a second test voltage value and to output a first test response and a second test response; and a test cell configured to receive the first test voltage and the second test voltage output by the test module, the test cell comprising a wordline, a bitline, and a memory film, the memory film interposed between the wordline and the bitline, wherein the test cell is configured to output a first response and a second response in response to receiving the first test voltage and the second test voltage; and a host controller configured to compare a first digital value based on the first test voltage and a second digital value based on the second test value to a first predetermined threshold and a second predetermined threshold, respectively, wherein the first predetermined threshold is a low threshold and the second predetermined threshold is a high threshold.

The first test response and the second test response that are output by the test cell are integrated to a charge through an integrating OpAmp arranged within an Application Specific Integrated Circuit (ASIC). The charge is read on a capacitor in the circuit as a voltage that gets converted into a digital value.

In some examples, the host controller is configured to output a result of the testing for the test call based on the comparing. In some examples, the first predetermined threshold is a digital value that represents a charge of about 0.1 nC to about 1 nC. In some examples, the first test voltage and the second test voltage that are received by the test cell are a first read operation and a second read operation, respectively, that are performed using a voltage that is less than a voltage that would change a state of the test cell. In some examples, the second predetermined threshold is a digital value that represents a charge of about 9 nC to about 11 nC or larger. In some examples, the first predetermined threshold and the second predetermined threshold are based on the characteristics of the test cell. In some examples, the result is that the test cell is not properly connected if the first digital value and the second digital value do not meet the first predetermined threshold and the second predetermined threshold. In some examples, the result is that the test cell is properly connected if the first digital value and the second digital value meet the first predetermined threshold and the second predetermined threshold. In some examples, the first test voltage and the second test voltage are the same.

BRIEF DESCRIPTION OF THE DRAWINGS

The accompanying drawings, which are incorporated in, and constitute a part of this specification, illustrate implementations of the present teachings and, together with the description, serve to explain the principles of the disclosure. In the figures.

It should be noted that some details of the figures have been simplified and are drawn to facilitate understanding of the present teachings rather than to maintain strict structural accuracy, detail, and scale.

DETAILED DESCRIPTION

Reference will now be made in detail to exemplary implementations of the present teachings, examples of which are illustrated in the accompanying drawings. Wherever convenient, the same reference numbers will be used throughout the drawings to refer to the same or like parts.

As used herein, "data" refers to any type of information, signal, or other result that is obtained from or sent to an electrical device such as a memory device, an integrated circuit, or another electrical device, or any information obtained from monitoring, interrogating, querying, or measuring, etc., an electrical device. The term "data" includes digital data, analog data, voltage values, current values, resistance values, vector values, scalar values, and/or flux values.

The XPM reading apparatus currently lacks a method of determining presence of the memory and proper electrical connection to the contacts robustly, without reading and writing fully to the memory. Generally speaking, implementations of the present disclosure provides for a method for reading a printed memory device, such as a XPM, which is more robust than the standard method used for reading the memory. The method uses XPM ASIC functions to set bit lines and word lines in high impedance such that individual cells of the memory are addressed. This allows for each cell to be verified as making good contact and also validates that the cell not producing excessive currents resulting in excessive charges, sometimes referred to as "leaking" or being "shorted". As one non-limiting example, 5 WLs amongst themselves and 5 BLS amongst themselves are physically connected to make a single large cell. In another non-limiting example, the memory device is read, written to, and then read back, which requires 3 memory operations to be performed. In just another non-limiting examples, a low voltage pulse is used to determine if all the cells are connected. This low voltage does not affect the memory in any way as it is below the switching voltage of the cell. This offers a way to check to make sure all WL pads and BL pads are making good contact, and ensures there are no shorted cells.

Figure 1:
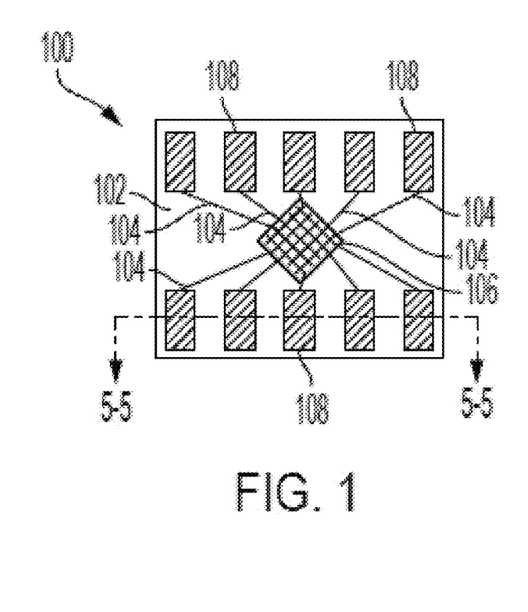
FIG. 1 is a plane view of a printed memory such as a XPM.

An example of a memory device 100, for example, a printed memory (i.e., printed memory device) 100 such as a XPM 100 is depicted in the plane view of FIG. 1. The structure and function of the XPM 100 is known and is only briefly discussed herein. The FIG. 1 printed memory 100 includes a substrate 102, for example, a flexible dielectric substrate 102, such as a flexible polymer substrate, that may include an adhesive backing layer to aid in attachment of the printed memory 100 to a surface of a product, a plurality of wiring lines (e.g., WLs and BLs) 104 and a ferroelectric layer 106 directly interposed or positioned between the WLs and the BLs. A memory cell that stores the logic bit or logic state is provided by and within the ferroelectric layer 106 at the physical location that is interposed between the intersection of each WL and BL. It will thus be appreciated that the WLs and BLs do not physically contact each other, but are physically separated by the ferroelectric layer 106. The printed memory 100 depicted in FIG. 1 includes ten wiring lines 104 (five WLs and five BLs), and thus the FIG. 1 device includes 25 memory cells and may thus store 25 bits of information. Each wiring line 104 terminates in a contact pad 108. Each memory cell can be individually addressed through two of the contact pads (i.e., through one WL and one BL). The plurality of contact pads 108 may be arranged in a rectangular shape in two or more rows and columns as depicted, or they may be arranged in a single column. It will be appreciated that a XPM may include other structures that are not described or depicted for simplicity, while various depicted structures may be removed or modified. Each memory cell of the printed memory 100 may be read by applying a suitable read voltage to two of the wiring lines 104 (i.e., to one word line and one bit line) and measuring an electrical response. To apply the read voltage, the plurality of contact pads 108 can be physically and/or electrically contacted with probe contacts of a reader. A voltage is applied across the contact pads 108 through probe contacts, and the resulting response is measured. Each memory cell may be individually addressed during a read cycle or write cycle (hereinafter, a memory operation), and one or more of the memory cells in the memory array may be read or written simultaneously or serially.

The contact pads 108 of the printed memory 100 and other electrical devices can be formed using a carbon-impregnated composite, electrically conductive inks such as silver nanoparticle ink, or one or more other suitable materials. These contact pads 108 can become scratched and degrade from repeated physical contact with, for example, electrical probes of a reader. Further, when direct physical contact is made between the reader and the printed memory 100, the reader must be correctly oriented with the printed memory 100.

Figure 2:
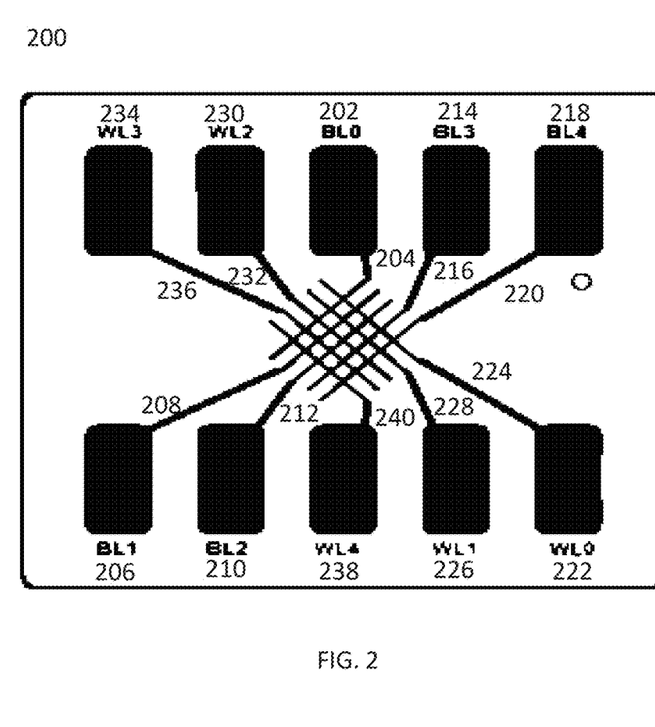
FIG. 2 is a schematic of the memory, showing both WLs and BLs.

FIG. 2 is a schematic of memory 200, showing both WLs and BLs. BL contact pad BL0 202 includes BL 204, BL contact pad BL1 includes 206 BL 208, BL contact pad BL2 210 includes BL 212, BL contact pad BL3 214 includes BL 216, and BL contact pad BL4 218 includes BL 220. WL contact pad WL0 222 includes WL 224, WL contact pad WL1 226 includes WL 228, WL contact pad WL2 230 includes WL 232, WL contact pad WL3 includes 234 WL 236, and WL contact pad WL4 238 includes WL 240.

Figure 3:
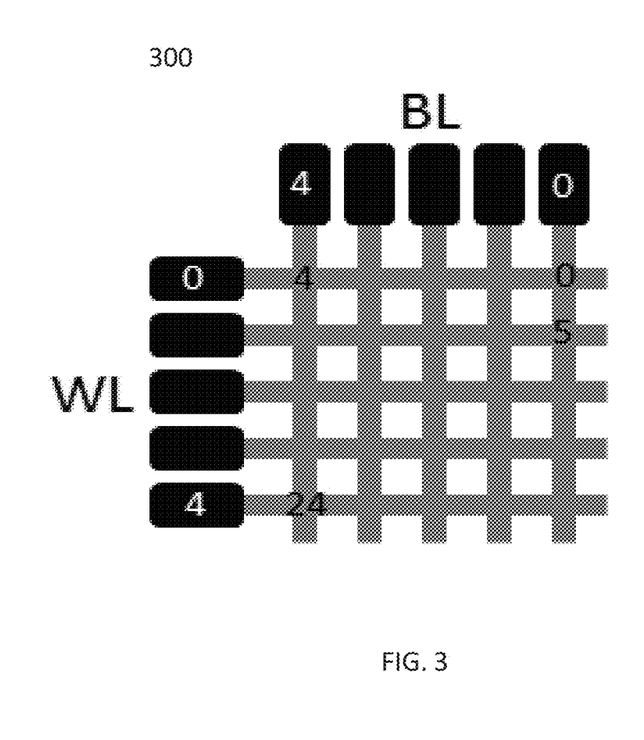
FIG. 3 is a simplified schematic of the memory.
Figure 4:
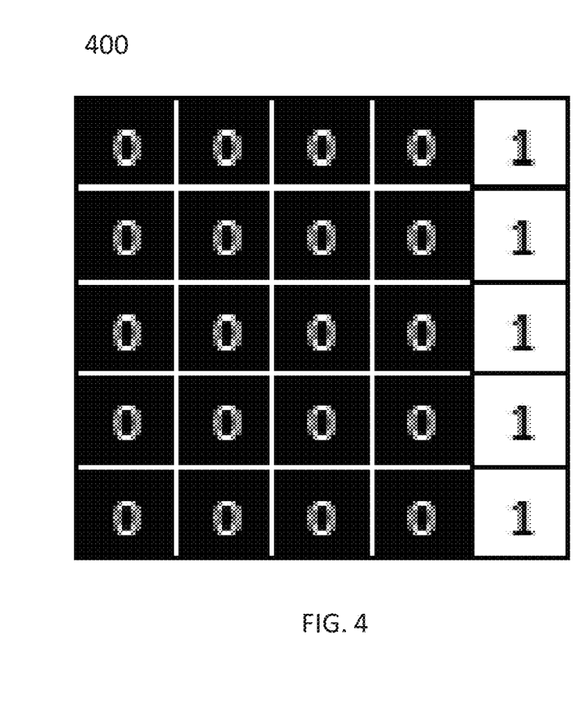
FIG. 4 shows cell analog values as converted into binary values.

FIG. 3 shows a simplified schematic of memory 300, where the numbers on electrode intersections denote the cell ID, according to examples of the present disclosure. If a pad is disconnected, e.g., pad of BL 0 in FIG. 3. then every cell of that BL is floating (cells 0, 5, 10, 15, 20). Three things will happen in the reading process: First, since the BL is floating, there will be no bias across the cells of that BL. Any cells that are in the '0' state will not flip because the driving force is missing. Second, since the bit line is disconnected, no current flows into the integrating amplifier connected to the pad. The charge values will be close to 0. Third, when the analog values are converted, all the cells on this disconnected bit line will be assigned a '1' because their charge values are far below the threshold. If the original pattern was all 0's and bit line 0 was disconnected one would end up with a pattern as shown in FIG. 4. FIG. 4 shows cell analog values 400 that are converted into binary values, where a cell becomes a '0' bit if its charge value is large, according to examples of the present disclosure.

A similar thing happens for a word line. First, since the word line is floating, there will be no bias across the cells of that word line. Any cells that are in the '0' state will not flip because the driving force is missing. Second, because no flipping is taking place, only small capacitive charge values are read on the floating lines. Third, when the analog values are converted, all the cells on this disconnected word line will be assigned a '1' because their charge values are below the threshold.

Figure 5:
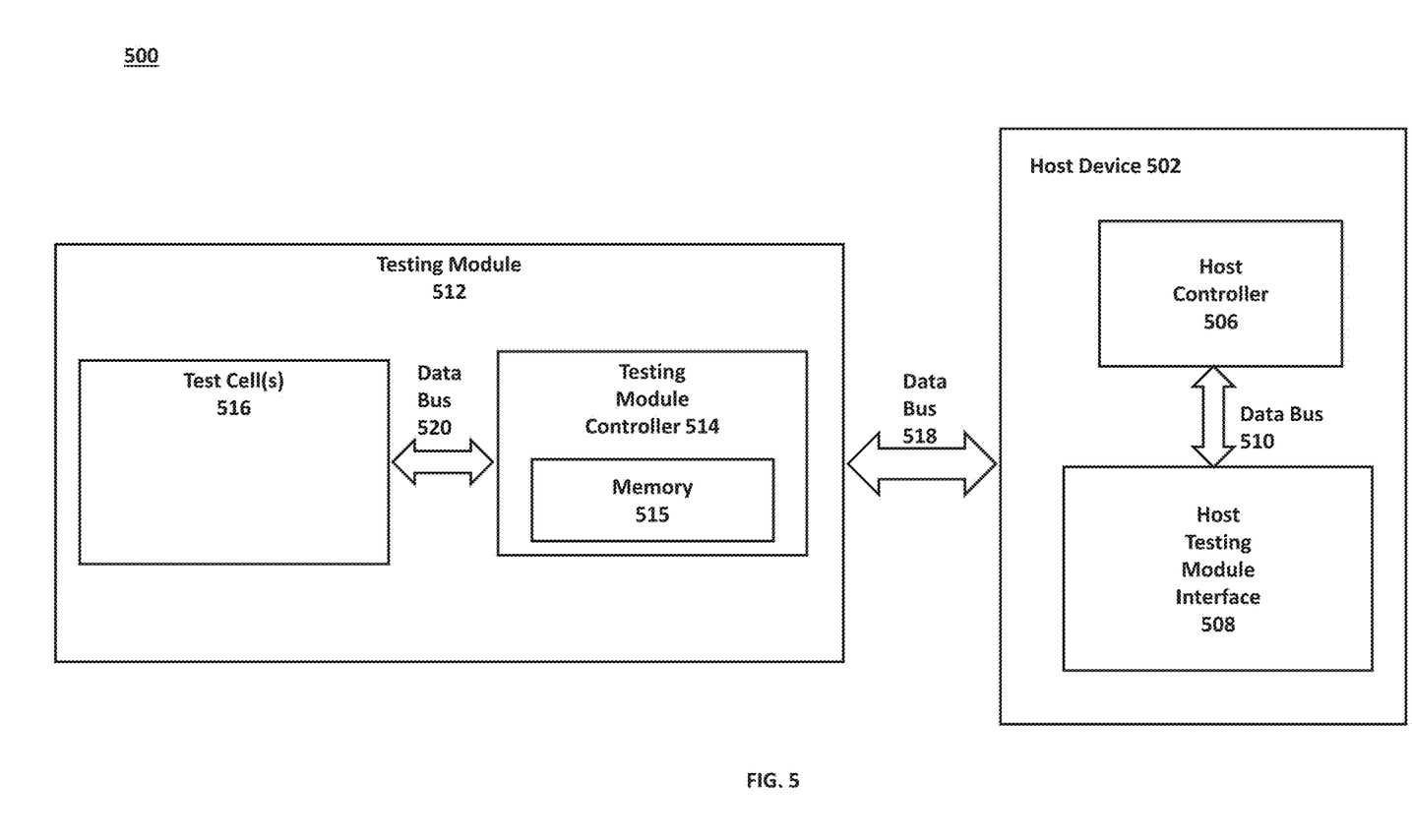
FIG. 5 is a schematic depiction of an electronic system 500 in accordance with an embodiment of the present teachings.

FIG. 5 is a schematic depiction of an electronic system 500 in accordance with an embodiment of the present teachings. FIG. 5 depicts a host device 502 for testing the memory which is installed. The host device 502 may include a host controller 506 in electrical communication with a host testing module interface 508 via a first data bus 510. The host device 502 is in electrical communication with a testing module 512 via a second data bus 518. The testing module 512 is configured to include a security protocol described herein to ensure that the test cell(s) 516 are an authentic component subsystem and not a counterfeit component subsystem.

The testing module 512 may include a testing module controller 514 and one or more test cells (e.g., one or more memory cells) 516. The testing module controller 514 can include a memory 515 and may be in electrical communication with the host device 502 through a second data bus 518 that is in electrical communication with the host testing module interface 508. The testing module controller 514 can be a microcontroller or an application-specific integrated circuit (ASIC) with a one-time programmable memory (OTP). The second data bus 518 may be, for example, a wired connection, including electrical contacts, and/or a wireless connection including a radiofrequency identification (RFID) device.

The test cells 516 may be in electrical communication with the module controller 514 through a third data bus 520. While FIG. 5 depicts an overview of one possible electronic system 500 design, it will be appreciated that other designs may include other features that are not depicted, while depicted features may be removed or modified. Moreover, the overview of FIG. 5 is not intended to individually depict all supporting electronics such as microprocessors, memory, power supplies, etc., which may be designed into the present teachings by one of ordinary skill in the art.

Figure 6:
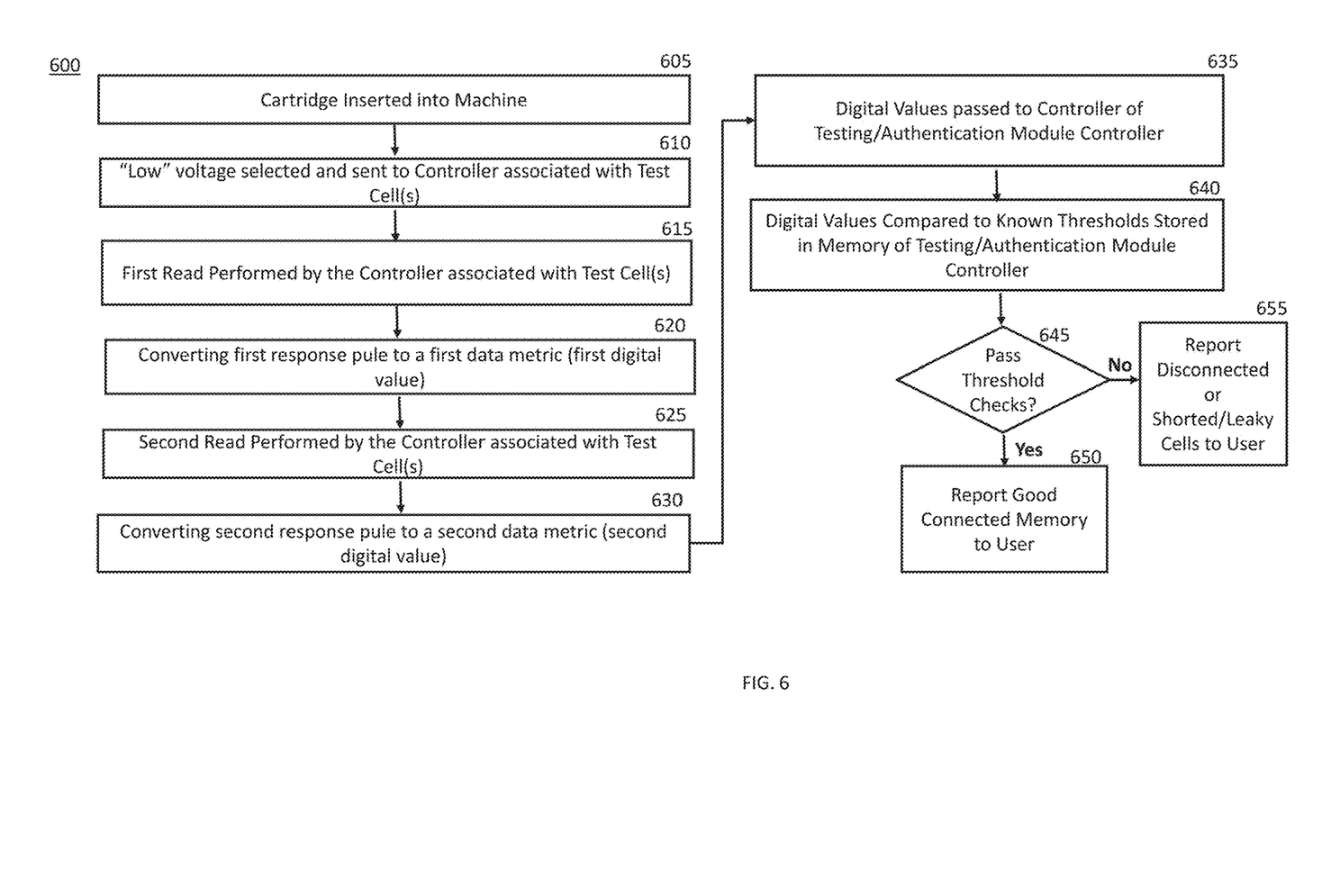
FIG. 6 shows a method to detect if any of the pads are disconnected is provided, according to examples of the present disclosure.

FIG. 6 shows a method 600 for detecting a printed memory device, according to examples of the present disclosure. The method 600 begins by inserting, at 605, a cartridge comprising a printed memory device into a machine. For example, in the context of a printing environment, the cartridge can be a printer toner device and the machine can be a printer or a multifunctional device (printer, copier, scanner, etc.).

The method 600 continues by selecting, at 610, a low voltage that is used for a read operation on the memory cell and sending an indication of low voltage that was selected to a controller. The low voltage that is used in the read operation is to ensure that there is a good contact in the cells of the printed memory device. By using a voltage below the switching voltage, any switching effects of the polarization of the cells can be avoided and the data stored in the cells are not affected. The low voltage only has the cell capacitive value plus parasitic capacitance picked up from the leads (of which the total can be anywhere from 0.1 nC to 1 nC of charge). By way of one non-limiting example, the low voltage for XPM can be about 12 volts or less depending on the thickness of the XPM. Other voltages can be considered low voltages based on the characteristics of the particular printed memory device. In some examples, the controller can be the testing module controller 514.

The method 600 continues by performing, at 615, a first low voltage read operation for each cell of the printed memory device by the microcontroller or the ASIC and is stored in memory 515 to write it back later. In some examples, prior to performing the low voltage read operation, an individual read operation can be performed on BLs and WLs for each cell of the printed memory device by placing all other WL and BL in high impedance before the read operation is performed.

The method 600 continues by converting, at 620, a first response pulse associated with the first read operation to a first data metric. For example, the first response pulse can be converted to a first digital value using the testing module controller 514.

The method 600 continues by performing, at 625, a second low voltage read operation for each cell of the printed memory device by the microcontroller or the ASIC.

The method 600 continues by converting, at 630, a second response pule associated with the second read operation to a first data metric. For example, the second response pulse can be converted to a second digital value using the testing module controller 514. In some examples, the digital conversion can be performed subsequent to both the first read operation and the second read operation or can be performed after each read operation The method 600 continues by providing, at 635, the first and the second data metric to the testing module controller 514 where they are compared, at 640, with a first and a second known threshold that are stored in the memory 515 of the testing module controller 514. The first threshold value is a low threshold value that provides a noise floor for parasitic capacitance and other noises which can make it appear there is something there when there is not. The first threshold value can be determined when there is not a printed memory device in contact with the testing module controller 514, such as when a machine or host is waiting for something to be fed into it. In one non-limited example, the machine or host can be a printer device. This first threshold provides for a calibrated baseline value that is used to detect when the printed memory device is not detected in the machine or host. The first threshold value can be saved in the controller 506 or in the memory 515 of the testing module controller 514 as a guard band can be added to make sure the printed memory device is present when the method 500 is run for detection purposes. The second threshold value is an upper threshold value that can be determined based on data that a "leaky" cell will give certain values, the same goes for a "shorted" cell. So, we then create an upper limit of what we would expect to see from the XPM at the low voltage based on that data we have from our current testing. In example, the first predetermined threshold is a digital value that represents a charge of about 0.1 nC to about 1 nC and the second predetermined threshold is a digital value that represents a charge of about 9 nC or larger.

The method 600 continues by determining, at 645, whether the digital values pass a threshold check performed by the testing module controller 514. If the digital values pass the threshold check, an indication of a good connected memory is provided to the user at 650 and if the digital values do not pass the threshold check, an indication of a disconnected or shorted/leaky cell is provided to the user at 655.

In some examples, the method 600 can be performed using other than the two read operations discussed above, such as, using a single read operation or any other number of read operations.

The present method has advantages over conventional approaches. The first advantage provides for an individual WL or BL is able to be detected as not being connected or defective in terms of leakage using the present method. In contrast, the conventional approaches involve shorting the all BL's together and all WL's together to make a single measurement, which has at least two disadvantages. The first disadvantage includes the possibility of determining whether a card was "present" with only a couple good connections, instead of all 5. The second disadvantage includes using a voltage of 1.8V versus the present method that uses a measurement using ~12V, which allows a higher noise tolerance in the measurements that increases reliability. The second advantage avoids the need for the additional writes and reads to determine if the connection is good, which may not fatigue the material of the printed memory device as much as a full read as the state of the material is not changing. The present method may only change a small portion of the polarization if any. However, after thousands of card detection executions, the state of the cells is still in or close to the original state. This helps in extending the life of the printed memory device as there is already a limited amount by which the printed memory device can be written or read.

Example 1

A number 10 was written to Xerox Printed Memory at a voltage that completely switches cells if addressed. The pulse width was set to 128 micro seconds. In a 25-bit binary code this is 0000000000000000000001010. Where the rightmost number represents cell 0. The XPM was then read with the dual pulse read method. Their values are recoded in Table 1. The table represents a 5×5 matrix of a total of 25 cells where first row represents word line 0 and first column bit line 0. The intersection of word line 0 and bit line 0 represents cell 0, the intersection of word line 0 and bit line 1, cell 1, the intersection of word line 1 and bit line 0, cell 5, etc. The values are in nC. The quantization error is 0.02 nC. First number in each table entry is the first read and second number is the second read of the dual read. The second read is the capacitive load of a ferro-electric cell. Subtracting the second value from the first value the charge associated with switching or not switching the polarization is obtained. These values are rendered in Table 2.

TABLE 1

| | | | | |
|---|---|---|---|---|
| 4.36, 0.84 | 0.84, 0.76 | 4.72, 0.88 | 0.80, 0.72 | 4.40, 0.76 |
| 4.28, 0.88 | 4.28, 0.88 | 4.68, 0.88 | 4.40, 0.80 | 4.32, 0.80 |
| 4.28, 0.84 | 4.36, 0.80 | 4.72, 0.80 | 4.56, 0.76 | 4.48, 0.72 |
| 4.60, 0.92 | 4.44, 0.80 | 4.80, 0.88 | 4.44, 0.84 | 4.24, 0.84 |
| 4.32, 0.80 | 4.40, 0.76 | 4.48, 0.84 | 4.56, 0.80 | 4.28, 0.68 |

TABLE 2

| | | | | |
|---|---|---|---|---|
| 3.52 | 0.08 | 3.84 | 0.08 | 3.64 |
| 3.40 | 3.40 | 3.80 | 3.60 | 3.52 |
| 3.44 | 3.56 | 3.92 | 3.80 | 3.76 |
| 3.68 | 3.64 | 3.92 | 3.60 | 3.40 |
| 3.52 | 3.64 | 3.64 | 3.76 | 3.60 |

By convention a flipped cell represents a '0'. Setting the threshold at 1 nC this means that cell 0 is 0, cell 1 is 1, cell 2 is 0, cell 3 is 1, cell 4 is 0, cell 5 is 0, etc. With cell 0 representing the rightmost digit, these values translate into the binary number of 0000000000000000000001010 or 10 in the decimal system. Since the reading process destroys the information the number 10 was written back to the XPM.

Example 2

The XPM of Example 1 was removed from the reader. The pulse width is set to a much smaller value, i.e., 16 us. The voltage to 13V. A reading at these settings yielded values in Table 3. This is interpreted that not a single cell is connected. The values are, in essence, capacitive load of the leads. This reading may also be used as an offset measurement, i.e., these capacitive leads may be subtracted from future readings to remove the effect of the leads. This may be only needed for long leads where the capacitive load is large.

TABLE 3

| | | | | |
|---|---|---|---|---|
| 0.08, 0.04 | 0.04, 0.04 | 0.04, 0.00 | 0.04, 0.04 | 0.04, 0.04 |
| 0.04, 0.04 | 0.04, 0.04 | 0.04, 0.04 | 0.00, 0.00 | 0.00, 0.04 |
| 0.00, 0.00 | 0.00, 0.00 | 0.00, 0.00 | 0.00, 0.00 | 0.00, 0.00 |
| 0.00, 0.00 | 0.00, 0.00 | 0.00, 0.00 | 0.00, 0.00 | 0.00, 0.00 |
| 0.00, 0.04 | 0.04, 0.04 | 0.00, 0.04 | 0.04, 0.04 | 0.04, 0.04 |

Example 3

The XPM from Example 1 was reconnected to setup of Example 2. A read was taken with the parameters of Example 2. Their values are in Table 4. They are the capacitive loads of the leads and cells. Since the capacitive load of the leads are so small they can be neglected. Since every read is significantly larger than those in Table 3 the interpretation is that every single cell is connected. This also means that every word line and bit line is connected; hence, the XPM is present and well connected. The values in Table 3 are smaller than the second reads in Table 1 because the driving voltage is smaller. It is small to stay below the threshold of switching. However, even small voltages may be able to switch the polarization if they are long enough present. For this reason the pulse width was held short as well. Capacitive loads are only sensitive to the RC time constant which in this case is at least an order smaller.

TABLE 4

| | | | | |
|---|---|---|---|---|
| 0.36, 0.36 | 0.32, 0.28 | 0.36, 0.36 | 0.28, 0.24 | 0.36, 0.32 |
| 0.36, 0.32 | 0.36, 0.36 | 0.36, 0.36 | 0.36, 0.32 | 0.40, 0.32 |
| 0.40, 0.44 | 0.36, 0.40 | 0.32, 0.36 | 0.36, 0.40 | 0.32, 0.40 |
| 0.40, 0.40 | 0.32, 0.32 | 0.36, 0.36 | 0.36, 0.36 | 0.32, 0.36 |
| 0.40, 0.40 | 0.36, 0.36 | 0.36, 0.36 | 0.40, 0.36 | 0.32, 0.36 |

Example 4

The pulse width and voltage of Example 3 was reset to its originals values of Example 1 and another read was taken. The values and their differences are shown in Table 5 and Table 6. Again cells 1 and 3 did not flip; hence, represent the value 1. All other cells flipped representing the value 0. This yields again the 25-bit binary number 0000000000000000000001010 or decimal number 10. In other words, the process of detecting the XPM in Example 3 did not destroy the stored information on it.

TABLE 5

| | | | | |
|---|---|---|---|---|
| 4.36, 0.88 | 0.80, 0.76 | 4.68, 0.88 | 0.80, 0.76 | 4.44, 0.76 |
| 4.28, 0.72 | 4.28, 0.72 | 4.68, 0.80 | 4.44, 0.72 | 4.36, 0.68 |
| 4.36, 0.88 | 4.44, 0.84 | 4.76, 0.84 | 4.64, 0.84 | 4.52, 0.76 |
| 4.60, 0.88 | 4.44, 0.84 | 4.80, 0.84 | 4.44, 0.84 | 4.28, 0.88 |
| 4.36, 0.72 | 4.36, 0.68 | 4.52, 0.72 | 4.56, 0.72 | 4.24, 0.60 |

TABLE 6

| | | | | |
|---|---|---|---|---|
| 3.48 | 0.04 | 3.80 | 0.04 | 3.68 |
| 3.56 | 3.56 | 3.88 | 3.72 | 3.68 |
| 3.48 | 3.60 | 3.92 | 3.80 | 3.76 |
| 3.72 | 3.60 | 3.96 | 3.60 | 3.40 |
| 3.64 | 3.68 | 3.80 | 3.84 | 3.64 |

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

While the present teachings have been illustrated with respect to one or more implementations, alterations and/or modifications can be made to the illustrated examples without departing from the spirit and scope of the appended claims. For example, it will be appreciated that while the process is described as a series of acts or events, the present teachings are not limited by the ordering of such acts or events. Some acts may occur in different orders and/or concurrently with other acts or events apart from those described herein. Also, not all process stages may be required to implement a methodology in accordance with one or more aspects or implementations of the present teachings. It will be appreciated that structural components and/or processing stages can be added or existing structural components and/or processing stages can be removed or modified. Further, one or more of the acts depicted herein may be carried out in one or more separate acts and/or phases. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. As used herein, the term "one or more of" with respect to a listing of items such as, for example, A and B, means A alone, B alone, or A and B. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated implementation. Finally, "exemplary" indicates the description is used as an example, rather than implying that it is an ideal. Other implementations of the present teachings will be apparent to those skilled in the art from consideration of the specification and practice of the disclosure herein. It is intended that the specification and examples be considered as exemplary only, with a true scope and spirit of the present teachings being indicated by the following claims.

What is claimed is:

1. A computer-implemented method for testing a printed memory device, the computer-implemented method comprising:
performing, by a controller, a first read operation on a cell of the printed memory device;
performing, by the controller, a second read operation on the cell;
determining, by the controller, a difference in charge values between a first charge value associated with the first read operation and a second charge value associated with the second read operation;
comparing, by the controller, the difference in charge values to a first predetermined threshold, a second predetermined threshold, or both the first predetermined threshold and the second predetermined threshold, wherein the first predetermined threshold is a low threshold and the second predetermined threshold is a high threshold;
converting, by the controller, the difference in charge values to a digital representation based on the comparing; and
providing, by the controller, a result of the test for the printed memory device based on the converting.

2. The computer-implemented method of claim 1, wherein the first predetermined threshold is a digital value that represents a charge of about 0.1 nC to about 1 nC.

3. The computer-implemented method of claim 1, wherein the first read operation and the second read operation is performed using a voltage that is less than a voltage that would change a state of the cell.

4. The computer-implemented method of claim 1, wherein the second predetermined threshold is a digital value that represents a charge of about 9 nC to about 11 nC.

5. The computer-implemented method of claim 1, wherein the first predetermined threshold and the second predetermined threshold are based on the characteristics of the printed memory device.

6. The computer-implemented method of claim 1, wherein the result is that the cell is not properly connected if the difference in charge values do not meet the first predetermined threshold, the second predetermined threshold, or both the first predetermined threshold and the second predetermined threshold.

7. The computer-implemented method of claim 1, wherein the result is that the cell is properly connected if the difference in charge values meet the first predetermined threshold, the second predetermined threshold, or both the first predetermined threshold and the second predetermined threshold.

8. An electronic system for testing a test cell comprising:
a host device;
a component subsystem installed in the host device, wherein the component subsystem comprises:
a test module configured to receive a first test voltage value and a second test voltage value and to output a first test voltage and a second test voltage; and
a test cell configured to receive the first test voltage and the second test voltage output by the test module, the test cell comprising a wordline, a bitline, and a memory film, the memory film interposed between the wordline and the bitline, wherein the test cell is configured to output a first response and a second response in response to receiving the first test voltage and the second test voltage; and
a host controller configured to determine a difference in charge values between a first charge value associated with a first read operation and a second charge value associated with a second read operation, compare the difference in charge values to a first predetermined threshold, a second predetermined threshold, or both the first predetermined threshold and the second predetermined threshold, wherein the first predetermined threshold is a low threshold and the second predetermined threshold is a high threshold, and convert the difference in charge values to a digital representation based on the difference in charge values that are compared.

9. The electronic system of claim 8, wherein the host controller is configured to output a result of the testing cell for a test call based on the difference in charge values that are compared.

10. The electronic system of claim 8, wherein the first predetermined threshold is a digital value that represents a charge of about 0.1 nC to about 1 nC.

11. The electronic system of claim 8, wherein the first test voltage and the second test voltage that are received by the test cell are the first read operation and the second read operation, respectively, that are performed using a voltage that is less than a voltage that would change a state of the test cell.

12. The electronic system of claim 8, wherein the second predetermined threshold is a digital value that represents a charge of about 9 nC to about 11 nC.

13. The electronic system of claim 8, wherein the first predetermined threshold and the second predetermined threshold are based on the characteristics of the test cell.

14. The electronic system of claim 9, wherein the result is that the test cell is not properly connected if the difference in charge values do not meet the first predetermined threshold, the second predetermined threshold, or both the first predetermined threshold and the second predetermined threshold.

15. The electronic system of claim 9, wherein the result is that the test cell is properly connected if the difference in charge values meet the first predetermined threshold, the second predetermined threshold, or both the first predetermined threshold and the second predetermined threshold.

16. The electronic system of claim 8, wherein the first test voltage and the second test voltage are the same.

* * * * *